(12) United States Patent
Kim

(10) Patent No.: US 7,816,179 B2
(45) Date of Patent: Oct. 19, 2010

(54) METHOD AND APPARATUS FOR FLIP-CHIP BONDING

(75) Inventor: Sang-cheol Kim, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 135 days.

(21) Appl. No.: 12/247,312

(22) Filed: Oct. 8, 2008

(65) Prior Publication Data
US 2009/0035891 A1   Feb. 5, 2009

Related U.S. Application Data

(62) Division of application No. 11/292,042, filed on Dec. 1, 2005, now Pat. No. 7,464,850.

(30) Foreign Application Priority Data
Aug. 11, 2005   (KR)   ............... 10-2005-0073738

(51) Int. Cl.
    *H01L 21/50*   (2006.01)
(52) U.S. Cl. ............... 438/108; 257/E21.499
(58) Field of Classification Search ............... None
    See application file for complete search history.

(56) References Cited

U.S. PATENT DOCUMENTS 3,735,911 A    5/1973   Ward
4,627,151 A   12/1986   Mulholland et al.
5,090,609 A    2/1992   Nakao et al.
5,500,502 A    3/1996   Horita et al.
6,394,158 B1   5/2002   Momeni
6,464,126 B2  10/2002   Hayata et al.
6,849,825 B2 *  2/2005   Tanaka ............... 219/121.82

FOREIGN PATENT DOCUMENTS

JP    62-291934    * 12/1987
JP    03-264159    * 11/1991
JP    2002-141376 A   5/2002

OTHER PUBLICATIONS

Patent Abstracts of Japan, english translation, JP 03-264159, Nov. 25, 1991.*
Patent Abstracts of Japan, english translation, JP 62-291934, Dec. 18, 1987.*

* cited by examiner

*Primary Examiner*—Scott B Geyer
(74) *Attorney, Agent, or Firm*—Drinker Biddle & Reath LLP

(57) ABSTRACT

Provided are a laser flip-chip bonding method having high productivity and excellent bonding reliability and a flip-chip bonder employing the same. The flip-chip bonder includes: a bonding stage on which a substrate rests; a bonding head picking up a semiconductor chip and attaching the semiconductor chip to the substrate; and a semiconductor chip heating unit heating the semiconductor chip to a bonding temperature. The semiconductor chip heating unit includes: a laser light source; and a lens assembly refracting a laser beam emitted by the laser light source to a top surface of the semiconductor chip so that a central position of the laser beam varies across the top surface of the semiconductor chip.

22 Claims, 8 Drawing Sheets

METHOD AND APPARATUS FOR FLIP-CHIP BONDING

CROSS-REFERENCE TO RELATED PATENT APPLICATION

This application is a divisional of U.S. patent application Ser. No. 11/292,042 filed Dec. 1, 2005, now allowed, which claims the benefit of Korean Patent Application No. 10-2005-0073738 filed on Aug. 11, 2005, in the Korean Intellectual Property Office, the disclosure of which is incorporated herein in its entirety by reference.

BACKGROUND OF THE INVENTION

1. Field of the Invention

The present invention relates generally to a flip-chip bonding method and an apparatus for flip-chip bonding employing the same, and more particularly, to a method and apparatus for flip-chip bonding semiconductor chips of various sizes by adjusting the diameter and irradiation direction of a laser beam.

2. Description of the Related Art

As electronic products are manufactured with smaller dimensions and increased functionality, integration density and performance of semiconductor chips have increased. To protect a highly integrated, high performance semiconductor chip against various hazardous external environment such as dust, moisture, and electrical or mechanical load, the demand for a lightweight, slim, compact, multi-pin semiconductor package increases.

Because it is difficult to provide compact, multi-pin semiconductor packages using conventional wire bonding, various new bonding techniques have been proposed to address such a limitation. Bump bonding, also called "flip-chip bonding", is one of the new bonding techniques which includes the steps of: placing bumps (for example solder bumps or gold bumps) on a pad that is an input/output terminal of a semiconductor chip; flipping over the semiconductor chip with the bumps facing down; and attaching the semiconductor chip directly to a carrier substrate or circuit pattern on a circuit tape.

Conventional flip-chip bonding techniques are mainly classified into two categories: thermo compression bonding and laser bonding. As disclosed in Japanese Laid-out Patent Publication No. 2002-141376, thermo compression bonding requires heating of a semiconductor chip for a long period time due to high heat loss in a heat transfer portion, which results in degradation of yield. Because a long time is required to reach the bonding temperature of bumps, this method cannot be applied to a material that is sensitive to high temperature. Another drawback of the thermo compression bonding is that a difference in the thermal expansion coefficient between a semiconductor chip and a substrate may result in a misalignment at a bonded portion between the semiconductor chip and the substrate. Yet another drawback is that damage such as a crack may occur in the bonded portion due to the contraction of the semiconductor chip and substrate after cooling.

Laser bonding involves moving bumps on a semiconductor chip to a bonded position to face designated bumps on a substrate and applying heat using a laser while pressing the semiconductor chip. The use of laser can result in high productivity and low thermal expansion coefficient.

FIG. 1 is a block diagram of a conventional bonding apparatus 10 for bonding lead terminals to bumps of a semiconductor chip by using a laser beam, disclosed in U.S. Pat. No. 5,500,502. Referring to FIG. 1, a semiconductor chip 1A having bumps 2A rests on a supporting base 1 and a lead frame having a plurality of lead terminals 9 is disposed on the semiconductor chip 1A. A laser beam 11 being emitted from a laser irradiation means 3 passes through a shutter 25, is reflected by a dichroic mirror 5, focused by a condenser lens 7 to irradiate and heat the lead terminal 9 and the semiconductor chip 1A such that the lead terminal 9 and the semiconductor chip 1A are bonded together.

A temperature sensor 13 receives infrared rays emitted by the lead terminal 9 while the lead terminal 9 and the semiconductor chip 1A are heated to generate an electric signal. The electric signal generated by the temperature signal 13 is first amplified by an amplifier 15 and then supplied to a filter circuit 17 whereby high frequency components are eliminated. The output signal of the filter circuit 17 is then converted to a digital signal by an analog-to-digital (A/D) converter 19 and inputted to a computer 21. The computer 21 determines the state of a contact between the lead terminal 9 and the bump 2A based on the signal supplied from the A/D converter 19, the result of the determination being displayed on a display unit 23. The computer also determines the state of the bond formed therebetween and the shutter 25 is opened or closed according to the result of the determination.

The conventional bonding using laser allows bonding only within an area on which the laser beam is focused by the condenser lens 7. Another drawback is that a laser beam has a Gaussian intensity profile when irradiated on a surface. Thus, when a laser beam is irradiated at the central portion during bonding, the light intensity is insufficient at the peripheral portion. When the intensity of the laser beam is increased to sufficiently irradiate the peripheral portion, the light intensity becomes extremely high at the central portion. In this case, the energy of a laser beam irradiated on the restricted area through the condenser lens 7 has a non-uniform distribution at central and peripheral portions.

The Gaussian intensity profile makes it difficult to uniformly irradiate the semiconductor chip 9. All bumps 2A on the semiconductor chip 9 cannot be evenly heated, resulting in a non-uniform energy distribution across the semiconductor chip 9. This non-uniform energy distribution leads to distortion due to thermal deformation of the semiconductor chip 9, reduction in bonding strength due to insufficient heating of some bumps 2A, and an increase in the heating time. Thus, there is a need to solve these problems. In particular, these problems become more severe when the sizes of semiconductor chips being mounted on a substrate vary.

In one attempt to solve the foregoing drawbacks and perform bonding over the entire area of the semiconductor chip 1A, a supporting base 1 has to be moved precisely to irradiate with the laser beam the positions where the bumps 2A are located. However, the distance that the supporting base 1 must move to irradiate all of the positions with a focused laser beam increases with the size of the semiconductor chip 1A. Thus, as can be appreciated, when the semiconductor chip 1A has a large size, it is difficult to precisely move the supporting base 1 and, furthermore, the supporting base 1 becomes bulky.

In view of the foregoing, an improved method and apparatus for flip-chip bonding using a laser would be welcomed.

BRIEF SUMMARY OF THE INVENTION

The present invention provides a flip-chip bonding method and apparatus using a laser, which offer high productivity and high solder bonding reliability.

The present invention provides a flip-chip bonding method and apparatus which uniformly irradiates a semiconductor chip with a laser beam.

The present invention also provides a flip-chip bonding method and apparatus designed to eliminate the need to move a bonding stage in order to perform bonding over the entire area of a semiconductor chip.

According to an aspect of the present invention, there is provided a flip-chip bonder including: a bonding stage on which a substrate rests; a bonding head for picking up a semiconductor chip and attaching the semiconductor chip to the substrate; and a semiconductor chip heating unit for heating the semiconductor chip to a bonding temperature. The semiconductor chip heating unit includes: a laser light source for emitting a laser beam; and a lens assembly refracting the laser beam so that a central position of the laser beam varies across the top surface of the semiconductor chip.

The lens assembly may further include at least one scan mirror that is disposed in an optical path between the laser light source and the semiconductor chip for refracting the laser beam to the top surface of the semiconductor chip.

Additionally, the lens assembly may include a focusing lens that is disposed in an optical path between the laser light source and the scan mirror for adjusting the laser beam diameter being irradiated on the top surface of the semiconductor chip to be bonded to the substrate. The lens assembly may also include a linear velocity adjusting lens that is disposed in an optical path between the scan mirror and the semiconductor chip for refracting the laser beam so as to irradiate the top surface of the semiconductor chip at a constant velocity. The linear velocity adjusting lens may be disposed within the bonding head.

The flip-chip bonder may further include: a scan mirror driver controlling the operation of the scan lens; and a laser driver controlling the laser light source. The flip-chip bonder may further include an optic fiber forming an optical path of a laser beam from the laser light source to the lens assembly.

In another embodiment, the semiconductor chip heating unit includes: a laser light source; a first scan mirror; and a second scan mirror in optical communication with the first scan mirror. The first scan mirror rotates about a first axis so that a laser beam emitted by the laser light source is refracted to move continuously in a first direction on the surface of the semiconductor chip. The second scan mirror rotates about a second axis oriented in a different direction than the first axis so that the laser beam is refracted to move continuously in a second direction on the surface of the semiconductor ship. Thus, the first and second scan mirrors cooperate to cause a central laser beam irradiation position to move continuously across the top surface of the semiconductor chip in two directions. The first axis may be perpendicular to the second axis.

According to another aspect of the present invention, there is provided a flip-chip bonding method including the steps of: aligning a semiconductor chip on a substrate; generating a laser beam by a laser light source; irradiating a top surface of the semiconductor chip with the laser beam so that a central position of the laser beam being irradiated moves continuously across the top surface of the semiconductor chip; and heating a portion of the semiconductor chip to be bonded to the substrate and bonding the semiconductor chip to the substrate.

In the step of irradiating the top surface of the semiconductor chip with the laser beam, at least one scan mirror is disposed in an optical path between the laser light source and the semiconductor chip for continuously moving the laser beam in a linear manner on the surface of the semiconductor chip. The laser beam may be refracted by two scan mirrors disposed in the optical path between the laser light source and the semiconductor chip.

In the step of irradiating the top surface of the semiconductor chip with the laser beam, the laser beam passing through the scan mirror may be refracted so as to irradiate the top surface of the semiconductor chip at a constant velocity. In this step, the scan lens and the laser light source may be driven independently or together. In the same step, the diameter of the laser beam may be adjusted according to the size of the semiconductor chip.

Alternatively, the flip-chip bonding method may further include the steps of: aligning a semiconductor chip on a substrate; generating a laser beam by a laser light source; adjusting the diameter of the laser beam according to the size of the semiconductor chip; using at least one scan mirror to continuously move the direction in which the laser beam is refracted; refracting the laser beam passing through the scan mirror so as to irradiate the top surface of the semiconductor chip with a laser beam moving with constant linear velocity on the top surface; uniformly irradiating the top surface of the semiconductor chip with the laser beam; and heating a portion of the semiconductor chip to be bonded to the substrate and bonding the semiconductor chip to the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

Figure 2:
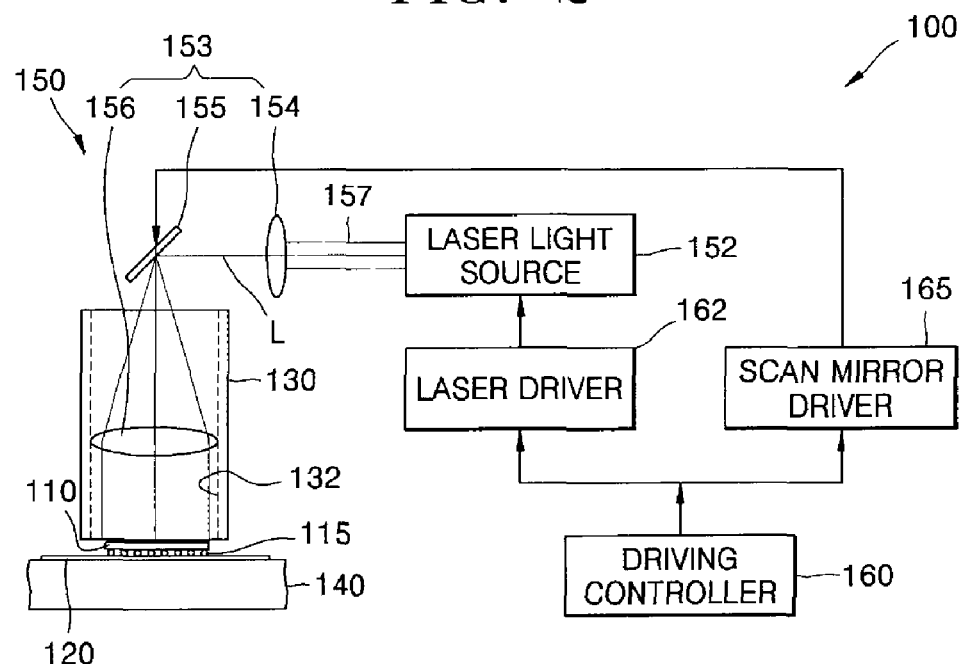
FIG. 2 is a block diagram of a flip-chip bonder according to a first embodiment of the present invention.

Referring to FIG. 2, a flip-chip bonder 100 according to a first embodiment of the present invention includes a bonding stage 140 (e.g., a platform), a bonding head 130, and a semiconductor chip heating unit 150. Substrates 120 transferred by a transporter (not shown) sequentially rest on the bonding stage 140. Although not shown in FIG. 2, a plurality of absorption (e.g., vacuum) flow paths are formed parallel to one another to penetrate into a top surface of the bonding stage 140. The absorption forces are generated through the absorption flow paths to enable the substrate 120 to fix securely to the bonding stage 140. The bonding stage 140 may include a heater (not shown) that preheats the substrate 120 to a predetermined temperature in order to reduce bonding time.

The bonding head 130 moves in a vertical direction over the bonding stage 140 such that a flipped over semiconductor chip 110 is pressed down on the substrate 120 sitting on the bonding stage 140. A pickup (e.g., vacuum) flow path 132 is formed within the bonding head 130 so as to pick up the semiconductor chip 110 by supplying a negative air pressure. Furthermore, the bonding head 130 presses the semiconductor chip 110 onto the substrate 120 by removing the negative air pressure or supplying positive air pressure within flow path 132.

Conductive bumps 115 are formed on the bottom surface of electrodes of the semiconductor chip 110 and welded between the electrodes of the semiconductor chip 110 and terminals on the substrate 120 so that the electrodes of the semiconductor chip 110 are bonded to the terminals on the substrate 120.

The semiconductor chip heating unit 150 includes a laser light source 152 and a lens assembly 153 irradiating the semiconductor chip 110 with a laser beam L that is emitted by the laser light source 152.

Figure 1:
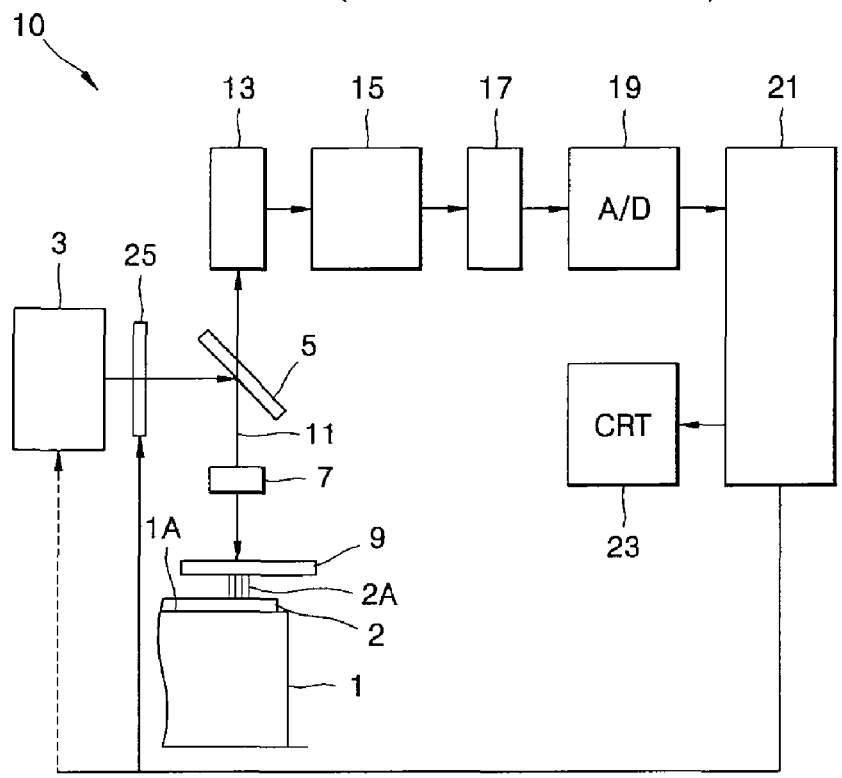
FIG. 1 is a block diagram of a conventional bonding apparatus for bonding lead terminals to bumps of a semiconductor chip by using a laser beam, disclosed in U.S. Pat. No. 5,500,502.

The lens assembly 153 refracts the laser beam L toward the top surface of the semiconductor chip so that a central laser beam irradiation position moves continuously across the top surface of the semiconductor chip 110, thus causing the laser beam L to be uniformly irradiated onto the top surface of the semiconductor chip 110. That is, the central laser beam irradiation position is not fixed on a portion of the top surface of the semiconductor chip 110 such as is shown in the conventional bonding apparatus of FIG. 1, but rather, the laser beam L is moved on the surface of semiconductor chip 110. By moving the laser beam L on the top surface of the semiconductor chip 110, light energy in an area irradiated with the laser beam is distributed evenly. Thus, because light intensity is neither insufficient nor extremely high in a portion of the top surface of the semiconductor chip 110, the semiconductor chip 110 can be uniformly attached to the substrate 120.

The lens assembly 153 includes at least one scan mirror 155. The scan mirror 155 is disposed in an optical path between the laser light source 152 and the semiconductor chip 110 for causing the laser beam L to scan or otherwise move linearly across the top surface of semiconductor chip 110 as shown in FIG. 3.

Figure 3:
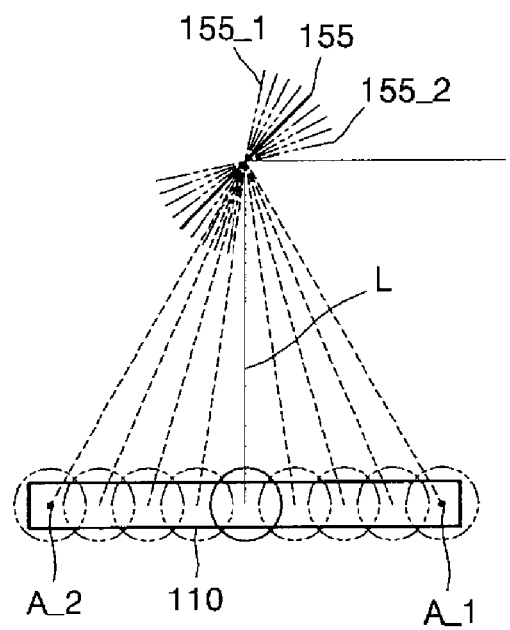
FIG. 3 shows a central laser beam irradiation position that changes as a scan mirror in the flip-chip bonder of FIG. 2 rotates.

Referring to FIG. 3, when the scan mirror 155 is located at a first position 155_1, a central laser beam irradiation position is located at one end A_1 of the semiconductor chip 110. As the scan mirror 155 rotates through a predetermined angle, the central laser beam irradiation position moves along the top surface of the semiconductor chip 110. When the scan mirror 155 rotates to a second position 155_2, the central irradiation position is located at the other end A_2. Thus, as the scan mirror 155 rotates through a predetermined angle, the central irradiation position moves linearly across the surface to chip 110 from one end A_1 to the other end A_2 thereby irradiating the entire top surface.

Figure 4:
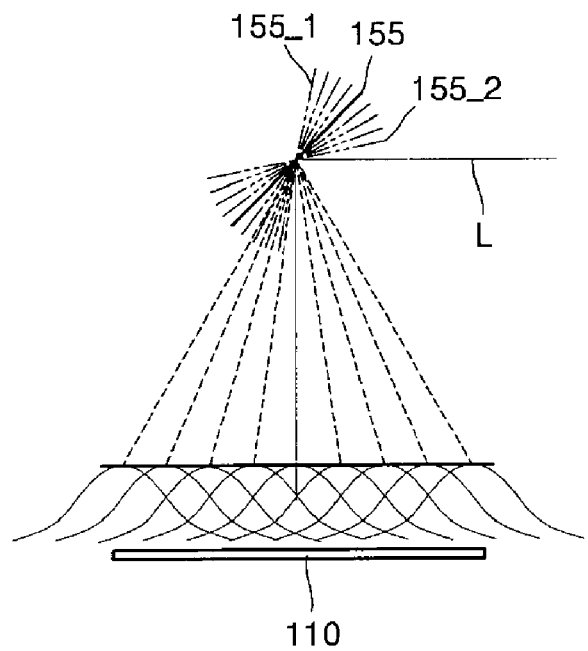
FIG. 4 shows a change in laser beam intensity on the top surface of a semiconductor chip when the central laser beam irradiation position varies as shown in FIG. 3.

In this case, when the scan mirror 155 rotates at a predetermined speed, and more desirably at a constant speed, each position on the top surface of the semiconductor chip 110 is irradiated with the laser beam L for the same period of time, as shown in FIG. 4. Thus, although the beam intensity of laser beam L may be higher at the center position of the beam than at a peripheral region of the beam, light intensity distribution is made uniform across the top surface of the semiconductor chip 110 by moving the laser beam L. This makes it possible to heat a portion of the semiconductor chip 110 bonded to the substrate 120 by scanning the laser beam L with the scan mirror 155 instead of moving the semiconductor chip 110.

Turning to FIG. 2, a focusing lens 154 is disposed in an optical path between the laser light source 152 and the scan mirror 155 for adjusting the diameter of the laser beam L at the position of the semiconductor chip 110 to be bonded to the substrate 120 (hereafter referred to as the "bonded position"). The focusing lens 154 may be a cylindrical lens configured to adjust the diameter of the incident laser beam L in one direction. Thus, even when the size of the semiconductor chip 110 varies, the focusing lens 154 adjusts the diameter of the laser beam L (e.g., to be equal to the top surface of the semiconductor chip 110) and the scan mirror 155 refracts the laser beam L to move along the surface of the semiconductor chip 110 in the longitudinal direction, thereby allowing efficient scanning of the laser beam L.

Furthermore, when the size of the semiconductor chip 110 varies, an offset value caused by position alignment between the semiconductor chip 110 and the substrate 120 is compensated for. That is, since a stroke of the bonding stage 140 does not need to be changed as in the prior art, it is possible to precisely control the movement of the bonding stage 140.

A liner velocity adjusting lens 156 is disposed in an optical path between the scan mirror 155 and the semiconductor chip 110 for refracting the laser beam L in such a way as to irradiate the top surface of the semiconductor chip 110 at a predetermined linear velocity, and more desirably at a constant linear velocity.

That is, due to the angular movement of the laser beam L when scanned through the scan mirror 155, the laser beam L may be projected and move on the surface of semiconductor chip 110 with a non-uniform linear velocity. Because the amount of light being scanned on the semiconductor chip 110 is proportional to the linear velocity, the linear velocity of the laser beam L varies so the amount of light scanned varies across the surface of the semiconductor chip 110 when the laser beam L is irradiated on the surface of the semiconductor chip 110 at equal angular velocity. In order to prevent this, a linear velocity adjusting lens 156 is disposed between the scan mirror 155 and the chip 110 to control the non-uniformity of light by making the linear velocity of the laser beam L uniform across the surface of the semiconductor chip 110. As shown, the linear velocity adjusting lens 156 may be disposed within the bonding head 130, but may alternatively be disposed otherwise.

The flip-chip bonder 100 may further includes an optic fiber 157, for example, delivering the laser beam L from the laser light source 152 to the lens assembly 153. The flip-chip bonder 100 further includes a scan mirror driver 165 for driving the scan mirror 155 and a laser driver 162 for driving the laser light source 152. More specifically, the scan mirror driver 165 drives the scan mirror 155 so that the laser beam L being irradiated on the semiconductor chip 110 scans according to the size of the semiconductor chip 110. The laser driver 162 drives the laser light source 152 at a predetermined power for a period of time when the laser beam L is irradiated. The operation of the scan mirror driver 165 and the laser driver 162 can be controlled by a single driving controller 160, but additional controllers may be provided.

The laser beam L may be infrared light of a wavelength sufficient to pass through the semiconductor chip 110. The laser light source 152 may be a silicon-based laser diode emitting near red light of a wavelength of about 1,064 nm in order to pass through the semiconductor chip 110. That is, the laser beam L is irradiated on a surface of the semiconductor chip 110 opposite the surface where the conductive bumps 115 are formed and passes through the semiconductor chip 110 so that the laser energy heats the conductive bumps 115. Furthermore, a flip-chip bonding method using laser according to the present invention uses the laser beam L to heat the semiconductor chip 110 and the conductive bumps 115 when bonding the conductive bumps 115 formed on contact pads on both the semiconductor chip 110 and the substrate 120.

Figure 5:
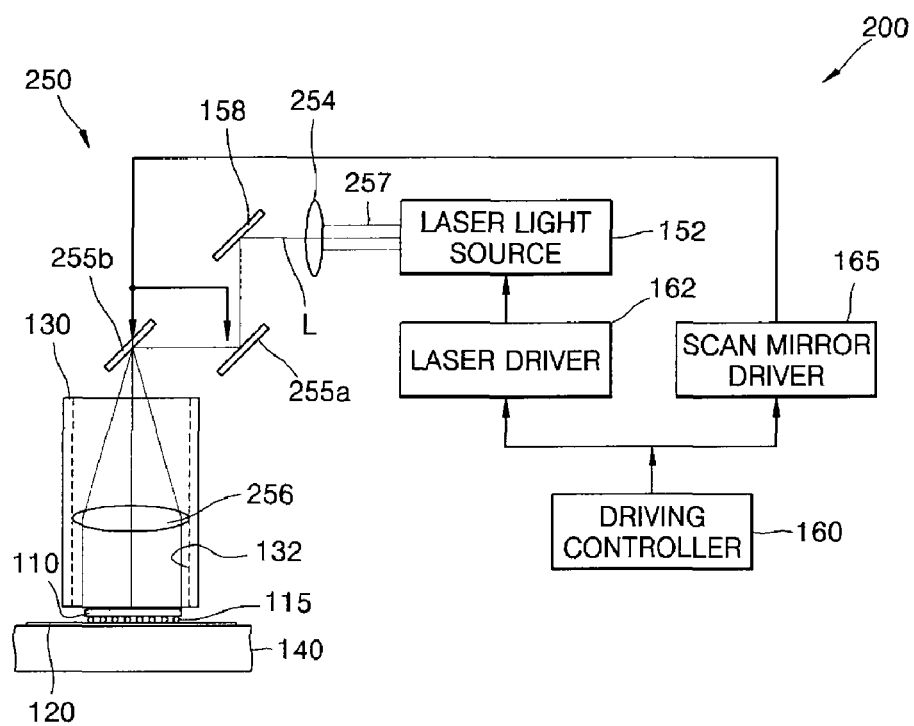
FIG. 5 is a block diagram of a flip-chip bonder according to a second embodiment of the present invention.
Figure 6:
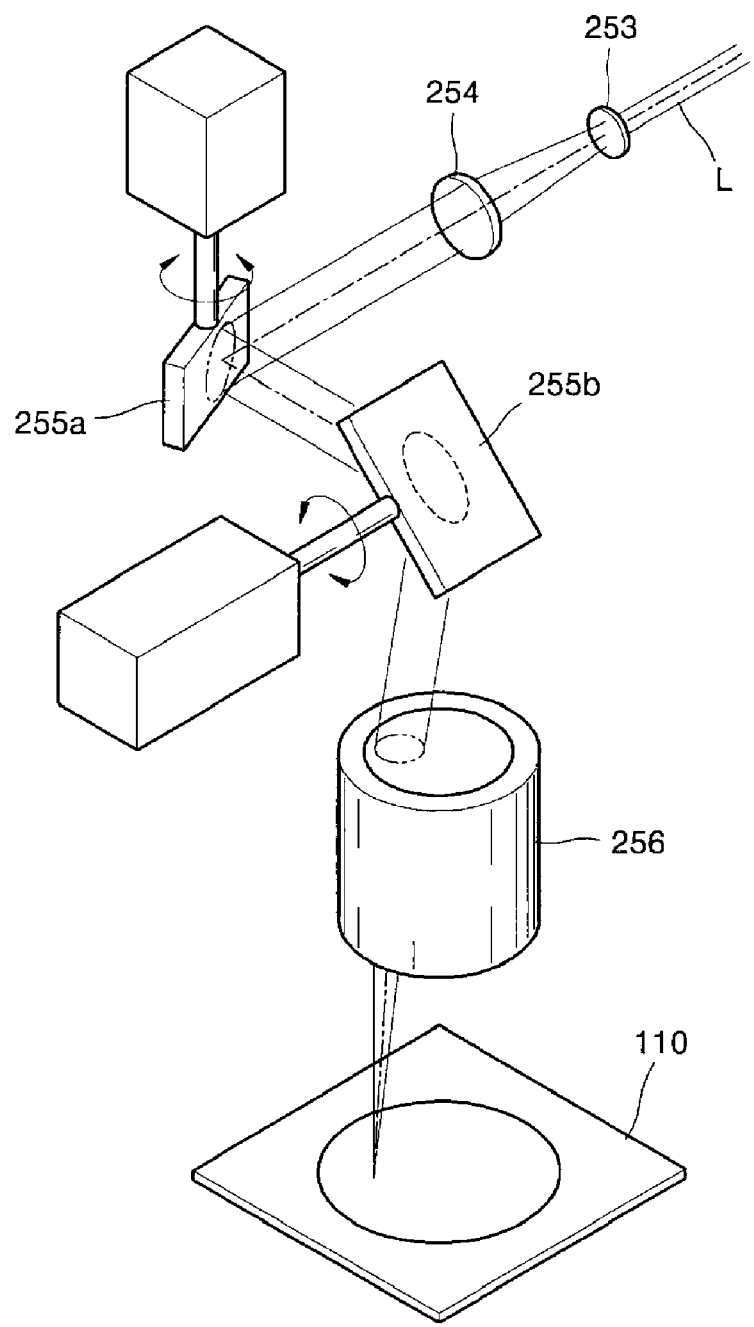
FIG. 6 is a perspective view of the semiconductor chip heating unit shown in FIG. 5.

FIG. 5 is a block diagram of a flip-chip bonder 200 according to a second embodiment of the present invention and FIG. 6 is a perspective view of a semiconductor chip heating unit shown in FIG. 5. Referring to FIGS. 5 and 6, the flip-chip bonder 200 includes a bonding stage 140, a bonding head 130, and a semiconductor chip heating unit 250. The semiconductor chip heating unit 250 includes a laser light source 152 and first and second scan mirrors 255a and 255b.

Because the bonding stage 140 and the laser light source 152 have the same structures and functions as their counterparts in the flip-chip bonder 100 of FIG. 2, a detailed explanation thereof will not be given for brevity.

The first scan mirror 255a rotates about a first axis (e.g., a vertical axis as shown in FIG. 6) and refracts laser beam L emitted by the laser light source 152. In this case, an angle at which the laser beam L is refracted varies continuously as the first scan mirror 255a rotates.

The second scan mirror 255b rotates about a second axis oriented in different direction than the first axis (e.g., a horizontal axis as shown in FIG. 6) and irradiates the laser beam L passing through the first scan mirror 255a onto the surface of the semiconductor chip 110. In this case, an angle by which the laser beam emitted from the first scan mirror 255a is refracted to the top surface of the semiconductor chip 110 varies continuously as the second scan mirror 255b rotates, thus allowing a central laser beam irradiation position to continuously move in two directions on a plane substantially coplanar with the top surface of the semiconductor chip 110.

When one scan mirror is used, scanning in one direction is provided. Thus, when the size of the semiconductor chip 110 is large, it may be difficult to uniformly scan across the surface of the semiconductor chip 110. However, when the first and second scan mirrors 255a and 255b are used, it is possible to two-dimensionally scan each position in the top surface of the semiconductor chip 110 (e.g., move the laser beam L in two directions such as x and y directions in a horizontal plane). As shown in FIG. 6, the flip-chip bonder 200 may further include at least one diffusing mirror 253 for diffusing the laser beam L.

Figure 7:
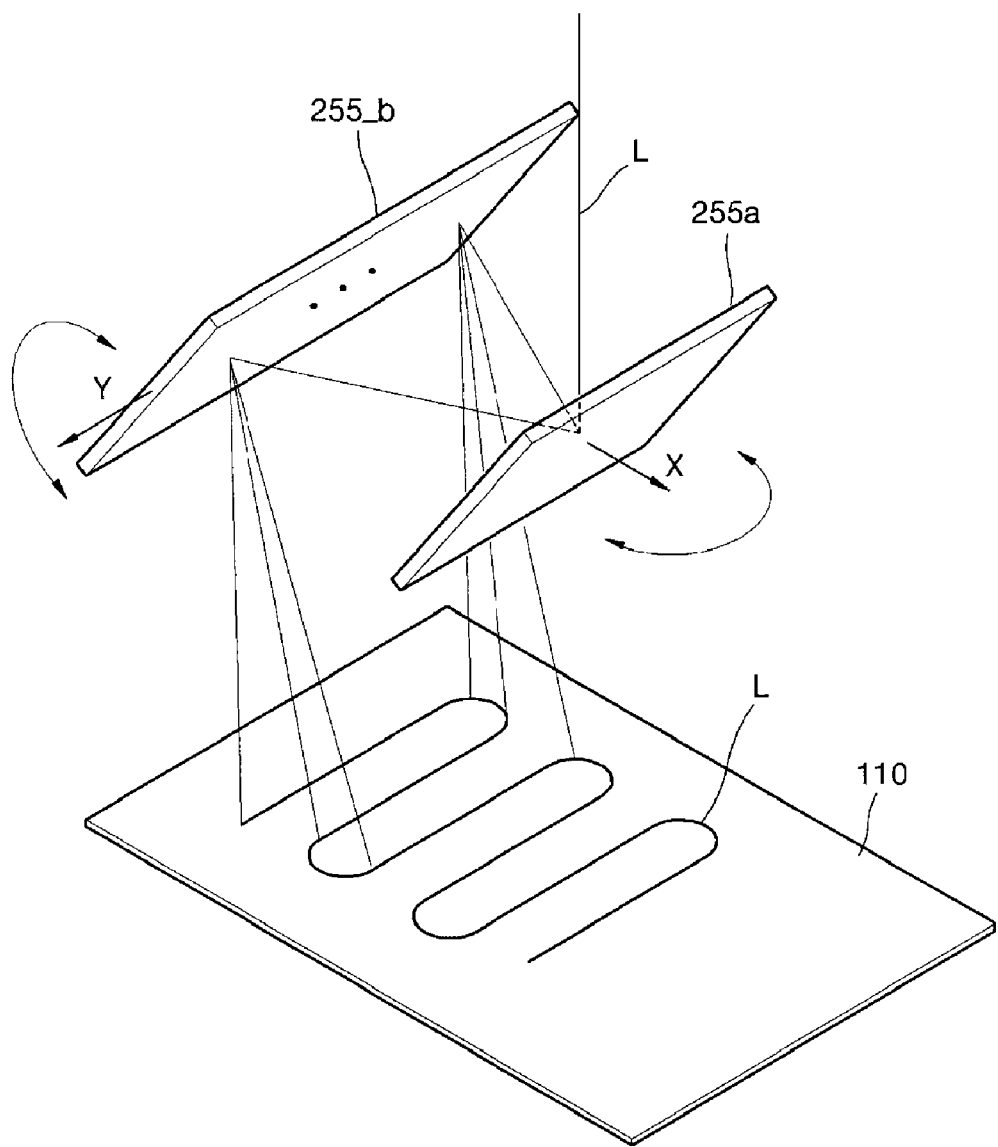
FIG. 7 shows a central laser beam irradiation position that changes as the first and second scan mirrors in the flip-chip bonder of FIG. 5 rotate.

In this embodiment, the first rotary axis of the first scan mirror 255a may be oriented generally perpendicular to the second rotary axis of the second scan mirror 255b. For example, as shown in FIG. 7, the first scan mirror 255a may rotate about an X-axis that is the first axis so that the laser beam L is irradiated in one direction while the second scan mirror 255b may rotate about a Y-axis that is the second axis so that the laser beam L is irradiated in another direction, thereby allowing the laser beam L to uniformly scan in a zigzag-type pattern across the top surface of the semiconductor chip 110. Thus, regardless of the size of the semiconductor chip 110, the entire surface of the chip 110 can be irradiated without having to move the chip 110 or stage 140. In particular, when the laser beam L is repetitively scanned at high speed, the intensity distribution of laser beam L irradiated on the top surface of the semiconductor chip 110 can be made uniform due to a time average effect.

Turning to FIG. 5, the semiconductor chip heating unit 250 further includes a focusing lens 254. The focusing lens 254 is disposed in an optical path between the laser light source 152 and the first scan mirror 255a for controlling the diameter of the laser beam L at the bonded position of the semiconductor chip 110. The focusing lens 254 has the same structure and function as its counterpart in the flip-chip bonder 100 of FIG. 2, and thus a detailed explanation thereof will be omitted.

An optic fiber 257 may create an optical path, for example, from the laser light source 152 to the focusing lens 254 or from the laser light source 152 to the first scan mirror 255a.

The flip-chip bonder 200 further includes a linear velocity adjusting lens 256. As shown, the linear velocity adjusting lens 256 is disposed in an optical path between the second scan mirror 255b and the semiconductor chip 110 for refracting the laser beam L so as to irradiate the top surface of the semiconductor chip at a predetermined, and more particularly, a constant linear velocity. Since the linear velocity adjusting lens 256 has the same structure and function as its counterpart in the flip-chip bonder 100 of FIG. 2, a detailed explanation thereof will be omitted. The linear velocity adjusting lens 256 may be disposed, for example, within the bonding head 130.

The flip-chip bonder 200 further includes a scan mirror driver 165 for driving the first and second scan mirrors 255a and 255b and a laser driver 162 for driving the laser light source 152. Although the scan mirror driver 165 and the laser driver 162 are illustrated as being controlled by a single driving controller 160, additional controllers may be provided.

Referring to FIG. 5, the flip-chip bonder 200 includes at least one reflective lens 158 refracting the laser beam L in a desired direction. Although not shown in FIGS. 2 through 4, the first embodiment of flip-chip bonder 100 may also include at least one reflective lens.

Figure 8:
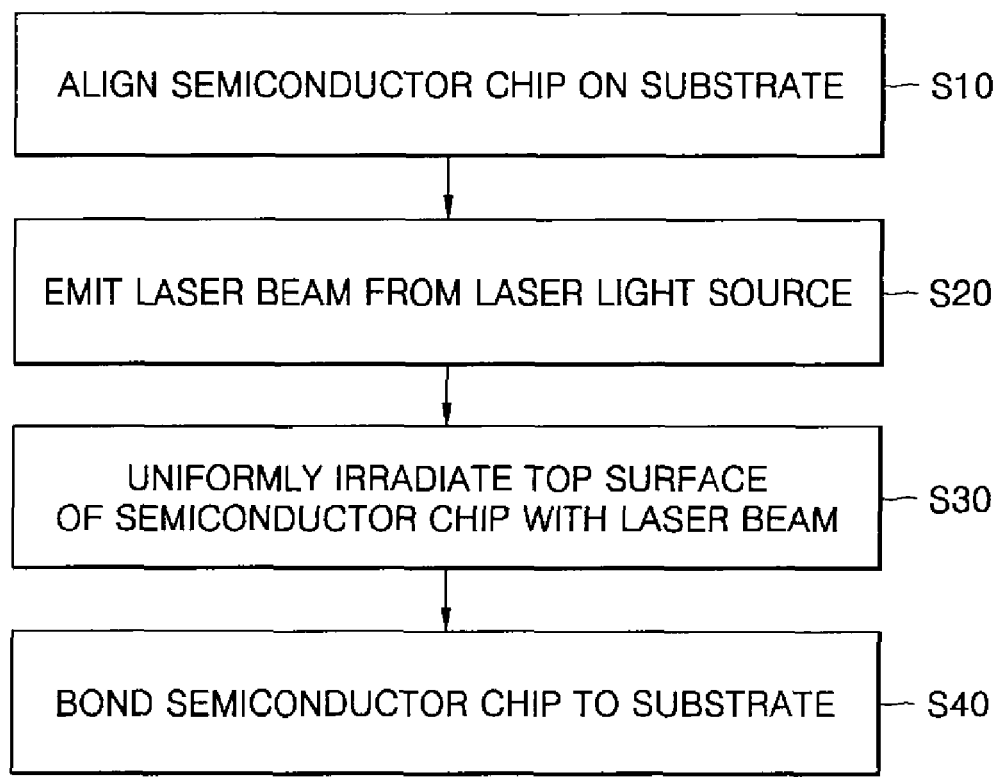
FIG. 8 is a flowchart illustrating a flip-chip bonding method according to an aspect of the present invention.
Figure 9:
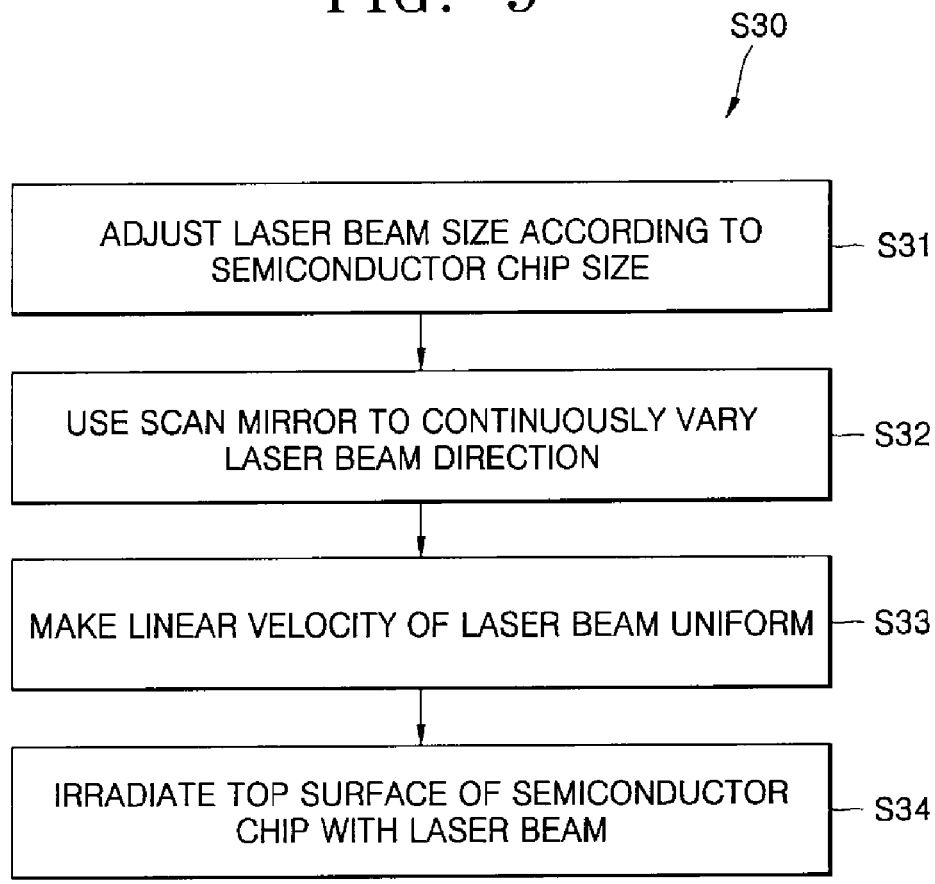
FIG. 9 is a flowchart illustrating the step S30 shown in FIG. 8.
Figure 10A:
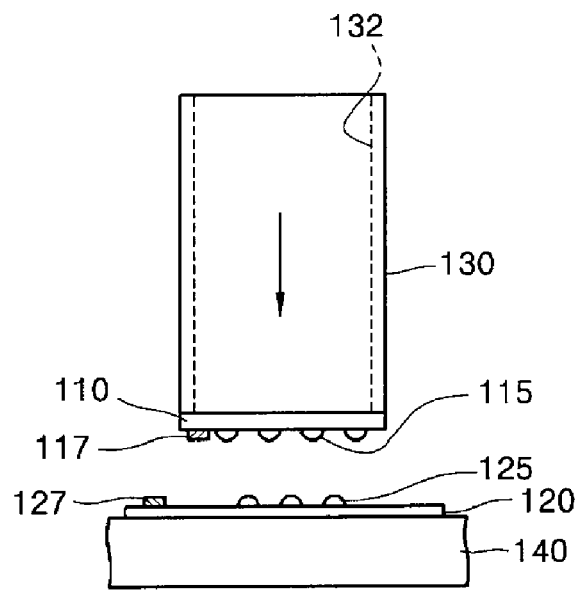
FIGS. 10A-10C illustrate the steps of the flip-chip bonding method of FIG. 8.
Figure 10B:
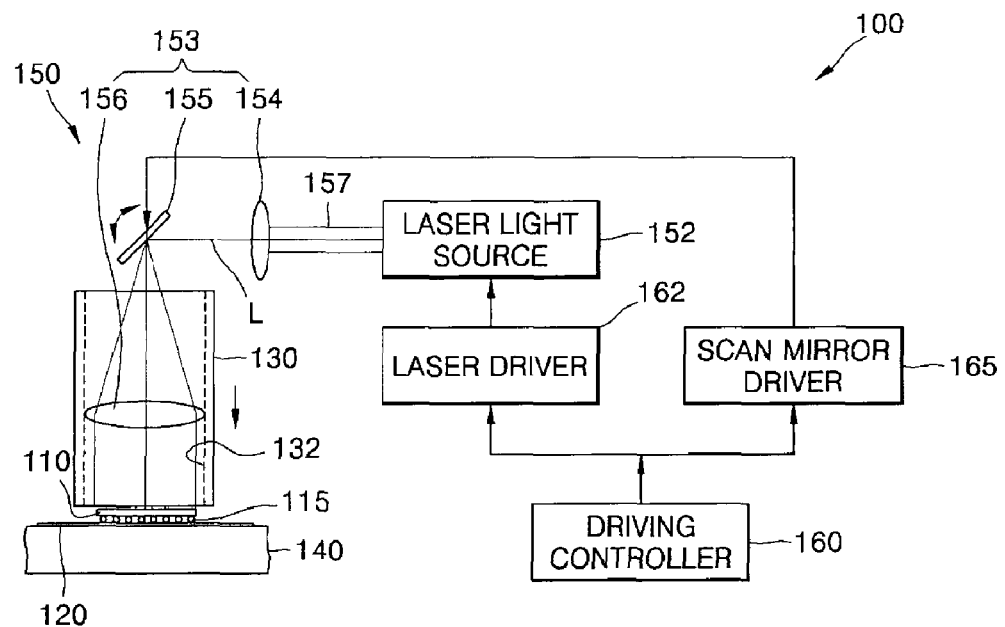
Figure 10C:
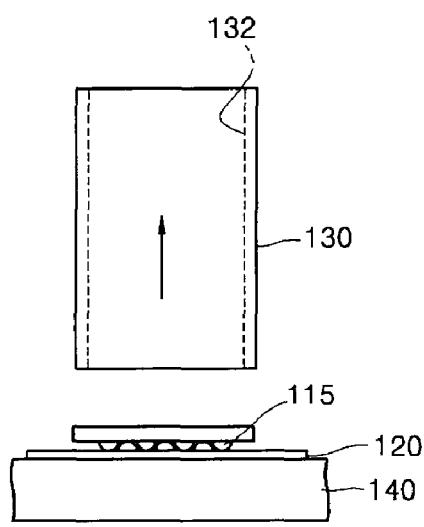

FIG. 8 is a flowchart illustrating a flip-chip bonding method according to another aspect of the present invention and FIG. 9 is a flowchart illustrating the step S30 shown in FIG. 8. FIGS. 10A-10C illustrate the steps of the flip-chip bonding method of FIG. 8. Referring now to FIG. 8, the flip-chip bonding method includes the steps of: aligning a semiconductor chip onto a substrate (S10); emitting a laser beam from a laser light source (S20); irradiating the top surface of the semiconductor chip with the laser beam so that a central laser beam irradiation position moves continuously across the top surface of the semiconductor chip (S30); and heating the semiconductor chip and bonding the semiconductor chip to the substrate (S40).

The steps of the flip-chip bonding method will now be described more fully with reference to FIGS. 8, 9, and 10A-10C. As shown in FIG. 10A, the substrate 120 is disposed on the bonding stage 140, which may be heated to a preset temperature. A vision system (not shown) uses an align mark 127 formed on the substrate 120 to obtain position information. The semiconductor chip 110 is, first, vacuum absorbed onto the bottom of the bonding head 130 through the pickup flow path 132 within the bonding head 130 and, next, the semiconductor chip 110 is position aligned on the substrate 120 by movement of the bonding head 130. In this case, the vision system recognizes an align mark 117 formed on the bottom surface of the semiconductor chip 110 to obtain position information of the semiconductor chip 110. A relative position offset between the semiconductor chip 110 and the substrate 120 is calculated and corrected. A bonding head 130 then moves downward so that the conductive bumps 115 on the semiconductor chip 110 contact electrodes 125 on the substrate 120.

As shown in FIG. 10B, laser beam L is emitted by the laser light source 152 in the step S20 and the laser beam L that is emitted by the laser light source 152 is irradiated onto the top surface of the semiconductor chip 110 so that a central laser beam irradiation position moves continuously across the top surface of the semiconductor chip in the step S30. More specifically, referring to FIGS. 9 and 10B, in step S31, the laser beam L emitted by the laser light source 152 is guided by the optic fiber 157 to pass through the focusing lens 154 for determining the diameter of the laser beam L. The laser beam L passing through the focusing lens 154 passes through at least one scan mirror 155 and is irradiated on the top surface of the semiconductor chip 110. In this case, as the scan mirror 155 rotates about one axis, the central position of laser beam L that is irradiated on the top surface of the semiconductor chip 110 moves continuously in step S32.

In some embodiments, the laser beam L passing through the focusing lens 154 may continuously move in two directions on the surface of the semiconductor chip 110. To accomplish this, two scan mirrors may be used as shown in FIG. 5. For example, as shown in FIG. 7 the laser beam L that has passed through the focusing lens 154 continuously scans in the X-axis direction as it passes through the first scan mirror 255a while continuously scanning in the Y-axis direction as it passes through the second scan mirror 255b.

Since the size of the semiconductor chip 110 is preset by the driving controller 160 upon recognition of the align mark 117, the scan mirror driver 165 is controlled by the driving controller 160 to rotate the scan mirror 155 through appropriate angles. The driving controller 160 also controls the laser driver 162 to generate laser beam L with required power for a required time of period.

In step S33, the linear velocity of the laser beam L that is refracted by the scan mirror 155 toward the top surface of the semiconductor chip 110 is made uniform by the linear velocity adjusting lens 156. Thus, in step S34, the laser beam L scans continuously at a constant velocity as the central position of laser beam irradiation moves across the top surface of the semiconductor chip 110. In this case, by repetitively scanning the laser beam L at high speed, the intensity distribution of laser beam L irradiated on the semiconductor chip 110 can be made uniform due to a time average effect.

The laser beam L that penetrates through the semiconductor chip 110 is converted into thermal energy at the conductive bumps 115 formed on the bottom surface of the semiconductor chip 110 (and the top surface of the substrate 120) such that the conductive bumps 115 are heated to bond with the electrodes 125 on the substrate. In the step S40, the bonding head 130 applies pressure to the semiconductor chip 110 in a vertical direction so that the conductive bumps 115 being heated by the laser beam L are pressed down and bonded to the electrodes 125 on the substrate 120.

As shown in FIG. 10C, when the semiconductor chip 110 cools down upon termination of irradiation of the laser beam L through the bonding head 130, the temperature of the conductive bumps 115 also decreases. When the conductive bumps 115 cool down and solidify, the vacuum for absorbing the semiconductor chip 110 is removed and the bonding head 130 moves upward to separate from the semiconductor chip 110, thereby completing the flip-chip bonding process.

In other embodiments, the semiconductor chip 110 may be flip-chip bonded to the substrate 120 by forming a thermosetting resin (not shown) on the substrate 120. In this case, the semiconductor chip 110 is thermally combined with the terminals on the substrate 120 and at the same time the semiconductor chip 110 and the substrate 120 are heated to cure the thermosetting resin between the semiconductor chip 110 and the terminals on the substrate 120. This eliminates the need for a separate step for sealing a gap between the semiconductor chip 110 and the substrate 120 to prevent external corrosion.

A flip-chip bonding method and a flip-chip bonder employing the same according to the present invention use laser to allow quick heating of a flip-chip and bumps, thus providing high productivity and excellent bonding reliability even when a temperature-sensitive substrate is used.

The present invention allows uniform heating of a semiconductor chip by moving the central position of laser beam irradiation uniformly across the entire top surface of the semiconductor chip, thereby preventing distortion of the semiconductor chip due to irregular heating.

The present invention allows a scan mirror for laser irradiation to rotate according to the size of the semiconductor chip, thereby eliminating the need to change a stroke of a bonding stage while allowing a precise control of a bonding stage.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flip-chip bonding method comprising:
    disposing a semiconductor chip on a substrate;
    aligning bumps of the semiconductor chip with bumps of the substrate;
    generating a laser beam by a laser light source;
    moving the laser beam on a top surface of the semiconductor chip to substantially irradiate the top surface; and
    pressing the semiconductor chip on the substrate to bond said bumps of the semiconductor chip with said bumps of the substrate.

2. The flip-chip bonding method of claim 1, wherein the moving step comprises:
    disposing a first scan mirror in an optical path between the laser light source and the semiconductor chip; and
    rotating the first scan mirror continuously about a first axis to refract the laser beam along the top surface of the semiconductor chip in a first direction.

3. The flip-chip bonding method of claim 2 wherein the moving step further comprises:
    disposing a second scan mirror in optical communication with the first scan mirror; and
    rotating the second scan mirror continuously about a second axis to refract the laser beam along the top surface of the semiconductor chip in a second direction.

4. The flip-chip bonding method of claim 3, wherein the first and second scan mirrors cooperate in the steps of rotating the first scan mirror and rotating the second scan mirror to move the laser beam with a constant linear velocity along the top surface.

5. The flip-chip bonding method of claim 3 wherein the first and second scan mirrors are rotated independently.

6. The flip-chip bonding method of claim 3 further comprising the step of orienting the first axis and the second axis to be generally perpendicular.

7. The flip-chip bonding method of claim 3 wherein the first and second scan mirrors cooperate in the steps of rotating the first scan mirror and rotating the second scan mirror to move the laser beam along at least one of a polylinear and a curvilinear path.

8. The flip-chip bonding method of claim 1, further comprising:

determining a size of the semiconductor chip; and adjusting a diameter of the laser beam according to the size from the determining step.

9. A flip-chip bonding method comprising:

moving a laser beam emitted from a laser light source on a surface of a semiconductor chip, the surface being opposite of a bump surface of the semiconductor chip; and contacting bumps on the bump surface to bumps on a surface of a substrate, wherein the moving step comprises:

configuring a first scan mirror in an optical path between the laser light source and the semiconductor chip; and rotating the first scan mirror about a first axis to direct the laser beam along the top surface of the semiconductor chip in a first direction.

10. The method of claim 9 wherein the moving step further comprises:

configuring a second scan mirror in optical communication with the first scan mirror; and rotating the second scan mirror about a second axis to direct the laser beam along the top surface of the semiconductor chip in a second direction.

11. The method of claim 10 wherein the first and second scan mirrors cooperate in the steps of rotating the first scan mirror and rotating the second scan mirror to move the laser beam with a constant linear velocity along the top surface.

12. The method of claim 10 wherein the first and second scan mirrors are rotated independently.

13. The method of claim 10 further comprising the step of orienting the first axis and the second axis to be generally perpendicular.

14. The method of claim 10 wherein the first and second scan mirrors cooperate in the steps of rotating the first scan mirror and rotating the second scan mirror to move the laser beam along at least one of a polylinear and a curvilinear path.

15. The method of claim 9 further comprising:

determining a size of the semiconductor chip; and adjusting a diameter of the laser beam according to the size from the determining step.

16. A flip-chip bonding method comprising:

determining a size of the semiconductor chip;

adjusting a diameter of the laser beam according to the size from the determining step;

moving a laser beam emitted from a laser light source on a surface of a semiconductor chip, the surface being opposite of a bump surface of the semiconductor chip; and contacting bumps on the bump surface to bumps on a surface of a substrate.

17. The method of claim 16 wherein the moving step comprises:

configuring a first scan mirror in an optical path between the laser light source and the semiconductor chip; and rotating the first scan mirror about a first axis to direct the laser beam along the top surface of the semiconductor chip in a first direction.

18. The method of claim 17 wherein the moving step further comprises:

configuring a second scan mirror in optical communication with the first scan mirror; and rotating the second scan mirror about a second axis to direct the laser beam along the top surface of the semiconductor chip in a second direction.

19. The method of claim 18 wherein the first and second scan mirrors cooperate in the steps of rotating the first scan mirror and rotating the second scan mirror to move the laser beam with a constant linear velocity along the top surface.

20. The method of claim 18 wherein the first and second scan mirrors are rotated independently.

21. The method of claim 18 further comprising the step of orienting the first axis and the second axis to be generally perpendicular.

22. The method of claim 18 wherein the first and second scan mirrors cooperate in the steps of rotating the first scan mirror and rotating the second scan mirror to move the laser beam along at least one of a polylinear and a curvilinear path.

* * * * *